(12) United States Patent
Ito

(10) Patent No.: US 8,407,021 B2
(45) Date of Patent: Mar. 26, 2013

(54) DELAY ANALYSIS DEVICE, DELAY ANALYSIS METHOD, AND DELAY ANALYSIS PROGRAM

(75) Inventor: Noriyuki Ito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 270 days.

(21) Appl. No.: 12/893,362

(22) Filed: Sep. 29, 2010

(65) Prior Publication Data

US 2011/0082657 A1    Apr. 7, 2011

(30) Foreign Application Priority Data

Oct. 5, 2009    (JP) .................. 2009-231728

(51) Int. Cl.
*G06F 19/00*    (2011.01)
(52) U.S. Cl. ........................................ 702/79
(58) Field of Classification Search ............ 702/79
See application file for complete search history.

(56) References Cited

FOREIGN PATENT DOCUMENTS

| JP | 08-006988 | 1/1996 |
|---|---|---|
| JP | 2000-222452 | 8/2000 |
| JP | 2001-067383 | 3/2001 |
| JP | 2008-102837 | 5/2008 |

OTHER PUBLICATIONS

Ferran Martorell, Error Probability in Synchronous Digital Circuits Due to Power Supply Noise, © 2007 IEEE, p. 170-175.*
Sean X. Shi, Latch Modeling for Statistical Timing Analysis, 2008 EDAA, 6 pages.*
"False-Path-Aware Statistical Timing Analysis and Efficient Path Selection for Delay Testing and Timing Validation", International Conference on Computer Aided Design, 2002, pp. 566-569.
Shuji Tsukiyama et al. "Techniques to Remove False Paths in Statistical Static Timing Analysis", ASICON, 2001, pp. 39-44.
Rajesh Garg et al. "On the Improvement of Statistical Timing Analysis", ICCD, 2006, 6 pages.
Vikram Iyengar et al. "Variation-Aware Performance Verification Using At-Speed Structural Test and Statistical Timing", International Conference on Computer Aided Design, 2007, pp. 405-412.

* cited by examiner

*Primary Examiner* — Tung S Lau
(74) *Attorney, Agent, or Firm* — Staas & Halsey LLP

(57) ABSTRACT

A delay analysis device includes an acquisition section that acquires circuit information relating to a path through which signal propagation can be delayed, a determination section that sets up an assumed fault for each of pins disposed in the path, and determines whether a signal change output from a beginning latch can be propagated to an ending latch for each of pins for which the assumed faults are set up, and an analysis section that calculates a delay distribution by accumulating delay distributions expressed by probability density functions of delays that occur in individual delay elements included in the path determined that a signal change output from the beginning latch can be propagated to the ending latch, and by not accumulating the delay distributions at a pin through which it has been determined that the signal change cannot be propagated to the ending latch based on the acquired circuit information.

12 Claims, 8 Drawing Sheets

☐ INDICATES LOGIC CIRCUIT  ▨ INDICATES FF

☐ INDICATES LOGIC CIRCUIT  ▨ INDICATES FF

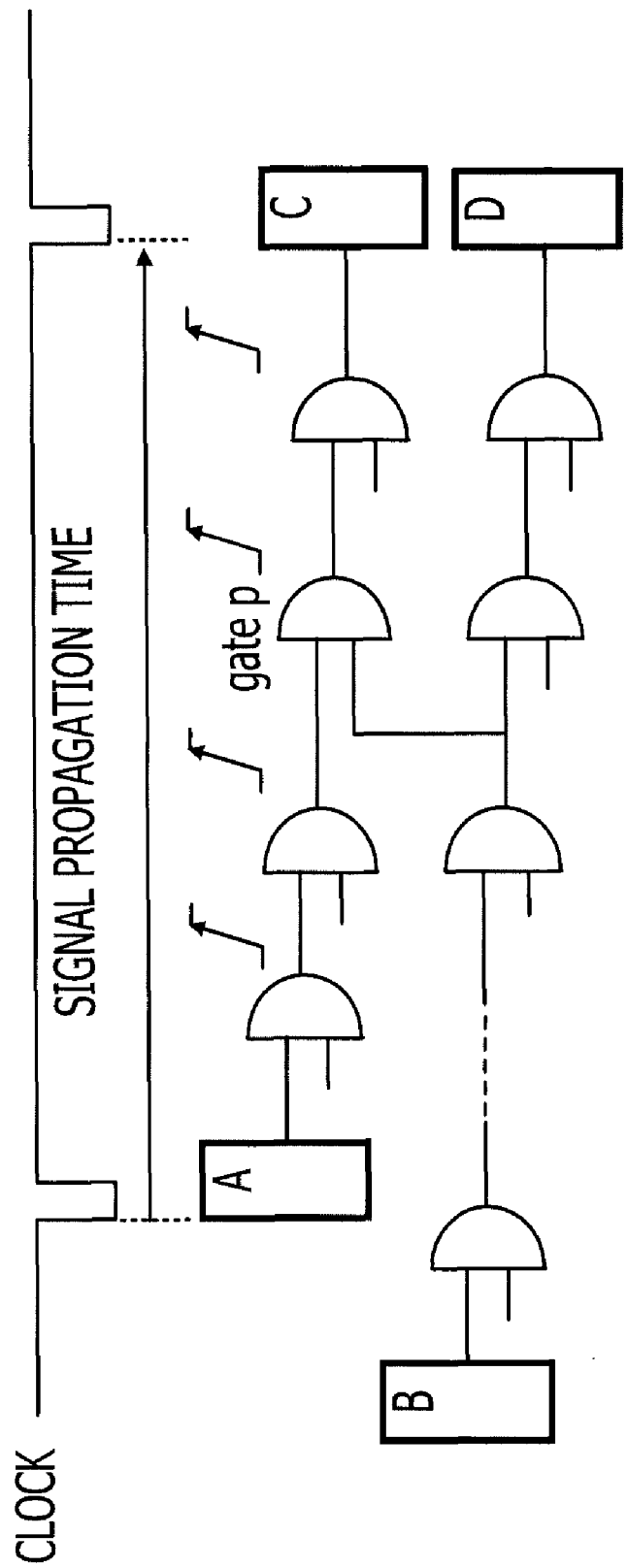

DELAY ANALYSIS DEVICE, DELAY ANALYSIS METHOD, AND DELAY ANALYSIS PROGRAM

CROSS-REFERENCE TO RELATED APPLICATIONS

This application is based upon and claims priority from prior Japanese Patent Application No. 2009-231723 filed on Oct. 5, 2009 in the Japan Patent Office, the entire contents of which are incorporated herein by reference.

BACKGROUND

1. Field

An embodiment of the present invention relates to a delay analysis device, a delay analysis method, and a delay analysis program.

2. Description of the Related Art

There has been known a method in which a timing analysis is utilized when the delay of an integrated circuit is analyzed.

The timing analysis is an analysis method in which the operating frequency of a chip is evaluated in a design stage using a CAD (Computer Aided Design) tool and it is confirmed whether or not a target operating frequency is realized. For example, when the chip is designed with the goal of realizing an operating frequency of 2.5 GHz, it is analyzed whether or not signals are transmitted among all memory devices in a time less than or equal to 400 ps, that is the inverse of 2.5 GHz.

Typically, the timing analysis is classified as either a static timing analysis or a dynamic timing analysis. In addition, the static timing analysis is classified into two analysis methods, namely, a static timing analysis (hereinafter, referred to as STA) which has been usually used, and a statistical static timing analysis (hereinafter, referred to as SSTA) which is an analysis method that has been proposed in recent years.

As examples of the STA, there are a deterministic static timing analysis, a path-based STA, and a block-based STA. In addition, as examples of the SSTA, there are a path-based SSTA and a block-based SSTA.

Here, the STA, the SSTA, and the block-based SSTA will be described with reference to FIG. 8.

In the STA, when the delay of a path is calculated, the delay values of individual elements such as gate devices and wires included in the path are subjected to a cumulative calculation performed in a direction toward the latter stages. The delay values at this time are individual fixed numerical values. The path-based STA is a method in which the cumulative calculation is performed preferentially in the direction of the depth of a circuit, and the block-based STA is a method in which the cumulative calculation is performed preferentially in the direction of the width of the circuit.

In the example illustrated in FIG. 8, in the case of the path-based STA, the cumulative calculation is performed for a path leading from a latch A to a latch C, a path leading from a latch B to the latch C, a path leading from the latch B to a latch D, in this order. In the case of the block-based STA, the delay values of individual gates are simultaneously accumulated in units of gates in directions from both the latch A and the latch B to an output side. Since a gate p has two inputs, a cumulative processing operation for the gate p is performed at the time when the cumulative calculation for both a path leading from the latch A to the gate p and a path leading from the latch B to the gate p is completed. When a processing operation for calculating a maximum delay is performed, the delay of the gate p is accumulated in the greater one of the two accumulated delays of the two paths leading to the gate p and the processing operation proceeds forward. In such a case in which one gate has a plurality of inputs, an operation in which a maximum delay is selected is called "MAX operation".

In contrast to the STA described above, in the SSTA, the delay values of individual elements such as gate devices and wires included in a path are not expressed as individual fixed numerical values but as probability density functions in which horizontal axis correspond to delay values and vertical axis correspond to probability densities. In addition, regarding the accumulation of the delay of the path, while a simple numerical value is added in the STA, the statistical addition of a probability density function is performed in the SSTA. In addition, while the MAX operation is a numerical operation in which a large numerical value is left in the STA, a statistics operation called "statistical MAX of two probability density functions" is performed in the SSTA. In the processing operation performed in the SSTA, the block-based SSTA is a method in which a cumulative calculation is performed preferentially in the direction of the width of the circuit, in the same way as described in the explanation of the block-based STA.

[Patent Document 1] Japanese Laid-open patent publication 2008-102837

[Patent Document 2] Japanese Laid-open patent publication 8-6988

[Patent Document 3] Japanese Laid-open patent publication 2000-222452

[Patent Document 4] Japanese Laid-open patent publication 2001-67383

[Non-patent Document 1] Jing-Jia Liou et al., "False-Path-Aware Statistical Timing Analysis and Efficient Path Selection for Delay Testing and Timing Validation", International Conference on Computer Aided Design, 2002, pp 566-569

[Non-patent Document 2] Shuji Tsukiyama et al., "Techniques to Remove False Paths in Statistical Static Timing Analysis", ASICON, 2001, pp 39-44

[Non-patent Document 3] Rajesh Garg et al., "On the Improvement of Statistical Timing Analysis", ICCD, 2006

[Non-patent Document 4] Vikram Iyengar et al., "Variation-Aware Performance Verification Using At-Speed Structural Test And Statistical Timing", International Conference on Computer Aided Design, 2007, pp 405-412

SUMMARY

According to an aspect of the invention, a delay analysis device includes an acquisition section that acquires circuit information relating to a path through which signal propagation can be delayed, a determination section that sets up an assumed fault for each of pins disposed in the path, and determines whether a signal change output from a beginning latch can be propagated to an ending latch for each of pins for which the assumed faults are set up, and an analysis section that calculates a delay distribution for the path by accumulating delay distributions expressed by using probability density functions of delays that occur in individual delay elements included in the path determined that a signal change output from the beginning latch can be propagated to the ending latch, and by not accumulating the delay distributions at a pin through which it has been determined that the signal change cannot be propagated to the ending latch based on the acquired circuit information.

The above-described embodiments of the present invention are intended as examples, and all embodiments of the present invention are not limited to including the features described above.

BRIEF DESCRIPTION OF THE DRAWINGS

FIG. 8 is an example of a pattern diagram of a circuit used for describing an STA and an SSTA.

DETAILED DESCRIPTION OF THE PREFERRED EMBODIMENTS

Figure 1:
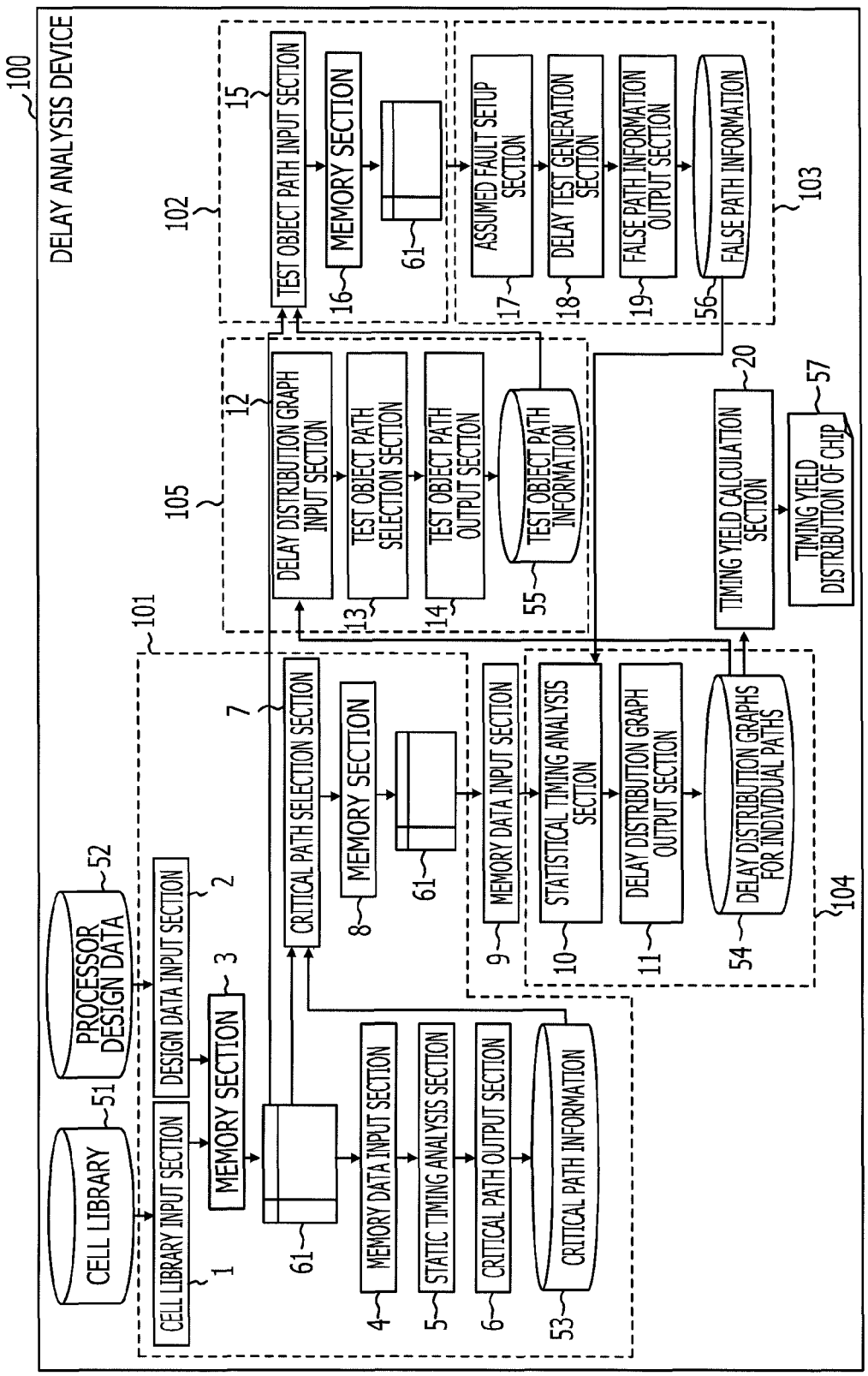
FIG. 1 is a diagram illustrating an example of a function block of a delay analysis device according to the embodiment.

Reference may now be made in detail to embodiments of the present invention, examples of which are illustrated in the accompanying drawings, wherein like reference numerals refer to like elements throughout.

The embodiment will be described hereinafter. A false path can be classified into three types. The first type is a functional false path which is logically an open path (penetrating path) and a blocked path (non-penetrating path) that is not activated in all execution sequences of instructions in an actual computer. The second type is a boolean untrue path which is a blocked path (non-penetrating path) that is not activated for all combinations of input values. The third type is a delay dependent false path which is a true path from the viewpoint of booleanic and a blocked path (non-penetrating path) that is not activated owing to timing of delays. In the embodiment, a method that is suitable for excluding a false path classified as the boolean untrue path will be illustrated. In addition, in the following description, a processor is cited as an integrated circuit that is an analysis object. However, the embodiment is applicable to all types of integrated circuits.

FIG. 1 illustrates a delay analysis device according to the embodiment. A delay analysis device 100 includes a cell library input section 1 which acquires a cell library 51 that has been used in the past, a design data input section 2 which acquires processor design data 52 that has been used in the past, and a memory section 3 for causing a memory 61 to store the acquired cell library 51 and the acquired processor design data 52.

In addition, the delay analysis device 100 includes a memory data input section 4 that acquires the cell library 51 and the processor design data 52 stored in the memory 61. The delay analysis device 100 includes a static timing analysis section 5. In addition, using the cell library 51 and the processor design data 52, the static timing analysis section 5 performs delay analysis in accordance with the STA. Accordingly, within the range in which the delay analysis can be performed in accordance with the STA, the static timing analysis section 5 specifies a plurality of critical paths that can be paths with which a processor does not operate at a designed operating frequency, owing to the delay of signal propagation in the processor. The delay analysis device 100 includes a critical path output section 6 that outputs critical path information 53 relating to the critical paths specified in the static timing analysis section 5.

In addition, the delay analysis device 100 includes a critical path selection section 7 which using the cell library 51 and the processor design data 52 stored in the memory 61, and the critical path information 53 which selects the necessary number of pairs of beginning latches and ending latches disposed in paths that can be paths through which signal propagation is delayed in the processor. In addition, the pairs selected in this way are called worst N paths, hereinafter. The number of worst N paths will be described later, and it may be assumed that the number is large enough to ensure the quality of the analysis result.

In addition, the delay analysis device 100 includes a memory section 8 that causes the memory 61 to store the pairs of a beginning latch and an ending latch, selected by the critical path selection section 7.

The delay analysis device 100 includes a memory data input section 9 that acquires the cell library 51 and the processor design data 52 stored in the memory 61, and the worst N paths. In addition, the delay analysis device 100 includes a statistical timing analysis section 10. Using the data acquired by the data input section 9, the statistical timing analysis section 10 applies a block-based SSTA to entire logic circuits disposed between a beginning latch and an ending latch in each path. Accordingly, the statistical timing analysis section 10 generates a delay distribution corresponding to the pair of the beginning latch and the ending latch. In addition, the delay analysis device 100 includes a delay distribution graph output section 11 which outputs as a delay distribution graph 54 a delay distribution generated by the statistical timing analysis section 10 that corresponds to each of pairs of beginning latch and ending latch.

The delay analysis device 100 includes a delay distribution graph input section 12 which acquires a delay distribution corresponding to a pair of a beginning latch and an ending latch from the delay distribution graph 54, and includes a test object path selection section 13 which calculates a value corresponding to $\alpha * \sigma$ ($\alpha$: constant, $\sigma$: standard deviation) with respect to each of the delay distributions and sorts the pairs of beginning latches and ending latches in descending order of value. The delay analysis device 100 includes a test object path output section 14 which outputs as test object path information 55 the sorted pairs of beginning latches and ending latches in a sorting order.

The delay analysis device 100 includes a test object path input section 15 which acquires the pairs of a beginning latch and an ending latch in descending order of delay value in the test object path information 55, and includes a memory section 16 that causes the memory 61 to store the acquired pairs of the beginning latch and the ending latch. The delay analysis device 100 includes an assumed fault setup section 17 which sets up a transition fault for each of the pins of logic circuits disposed between a beginning latch and an ending latch which are to be processing objects in the memory 61 in accordance with a method of the related art, the transition fault being one of delay fault models and an assumed fault.

The delay analysis device 100 includes a delay test generation section 18 which tries to create a pattern for each of the assumed faults set up, the pattern being supposed to cause a signal change to occur between a beginning latch and an ending latch that are to be processing objects. The delay analysis device 100 includes a false path information output section 19 which outputs as false path information 56 the in-circuit identification name of a pin for each pair of a beginning latch and an ending latch that are current processing objects, the pin being determined as a blocked path (false path) by the delay test generation section 18.

Furthermore, the statistical timing analysis section 10 re-executes the SSTA that was executed first. In addition, a delay distribution is propagated with a logic circuit being forward-traced from the former stage to the latter stage in order to obtain a statistical delay distribution for the logic circuit disposed between a pair of a beginning latch and an ending latch when the SSTA is re-executed. In addition, in the processing operation in which the delay distribution is propagated with the logic circuit being forward-traced, a processing operation is performed in which the pin list of a false path is acquired from the false path information 56 and the delay distribution is not propagated from a pin cited in the pin list to the latter stages during the propagation of the delay distribution.

The delay analysis device 100 includes a timing yield calculation section 20 which calculates a timing yield distribution 57 for the processor by performing the SSTA processing operation in accordance with a method of the related art using the delay distribution obtained for the pair of the beginning latch and the ending latch by the above-mentioned processing operation.

In addition, it is assumed that a pair selection section 101 includes the memory 61 and individual functional sections ranging from the cell library input section 1 to the memory section 8. It is assumed that an acquisition section 102 includes the test object path input section 15, the memory section 16, and the memory 61. It is assumed that a determination section 103 includes the assumed fault setup section 17, the delay test generation section 18, the false path information output section 19, and the false path information 56.

In addition, it is assumed that an analysis section 104 includes the statistical timing analysis section 10, the delay distribution graph output section 11, and the delay distribution graphs 54 that correspond to individual paths. In addition, it is assumed that a sort section 105 includes the delay distribution graph input section 12, the test object path selection section 13, the test object path output section 14, and the test object path information 55.

Next, the operation of the delay analysis device 100 will be described with reference to FIG. 2. In addition, in the following description of the operation, descriptions relating to units such as the memory section 3 and the memory data input section 4 or the like which perform input/output operations for individual data will be omitted.

The static timing analysis section 5 performs a traditional STA processing operation for the cell library 51 and the processor design data 52, and outputs critical path information (S1). Next, the critical path selection section 7 selects worst N paths from the critical path information 53 (S2).

A method for obtaining the number (N) of paths selected as worst N paths will be described. First, the critical path selection section 7 obtains the frequency yield distribution of the entire chip on the basis of individual delay distributions corresponding to N pairs of a beginning latch and an ending latch, and furthermore obtains the frequency yield distribution of the entire chip on the basis of individual delay distributions corresponding to (N+1) pairs of beginning the latch and the ending latch. When a difference between the two obtained frequency yield distributions is less than or equal to a predetermined value, it is determined that data corresponding to the N+1th path is unnecessary, and N in this case is regarded as the number of worst N paths.

In addition, the frequency yield of the entire chip is a graph in which the horizontal axis corresponds to maximum operating frequencies and the vertical axis corresponds to the percentage of the number of chips, the maximum operating frequencies being obtained by measuring maximum operable operating frequencies with respect to individual manufactured chips. In addition, regarding how to determine the difference between the frequency yield distributions in the embodiment, a difference between two maximum operating frequency values that are located at a percentage which is a target percentage on the vertical axis is obtained, and when the difference between the values is less than or equal to a predetermined value, it is defined that there is no difference between the frequency yield distributions. How small the predetermined value is depends on an expected accuracy.

After that, the statistical timing analysis section 10 performs an SSTA processing operation in units of pairs of a beginning latch and an ending latch selected by the critical path selection section 7, and creates the delay distribution graphs 54 corresponding to the individual pairs (S3). In addition, it is assumed that the statistical timing analysis section 1 performs a block-based statistical timing analysis.

Figure 3A:
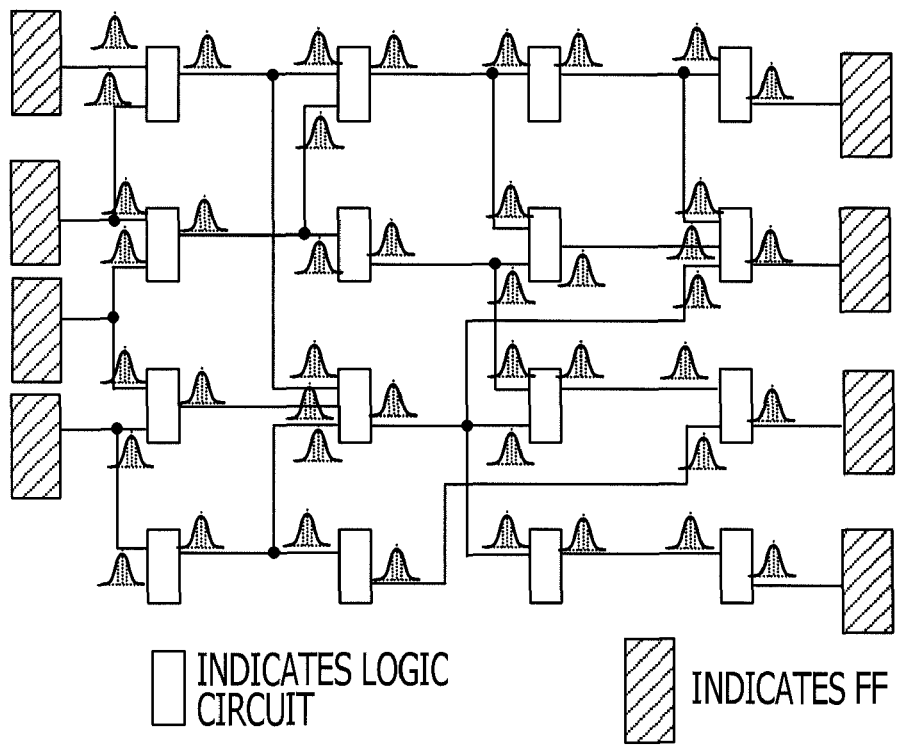
FIGS. 3A and 3B are diagrams illustrating a range in application of an SSTA of the related art and a range in application of an SSTA according to the embodiment, respectively.

Here, a range in application of an SSTA of the related art and a range in application of an SSTA according to the embodiment will be described with reference to FIGS. 3A and 3B. In the related art, an SSTA (block-based SSTA) is applied to an entire integrated circuit (refer to FIG. 3A). On the other hand, in the embodiment, a block-based SSTA is applied to circuits disposed between a pair of a beginning latch and an ending latch which are determined as a critical path as the result of an STA (refer to FIG. 3B). In addition, in FIGS. 3A and 3B, the beginning latch and the ending latch are expressed as flip-flops (FFs).

Figure 3B:
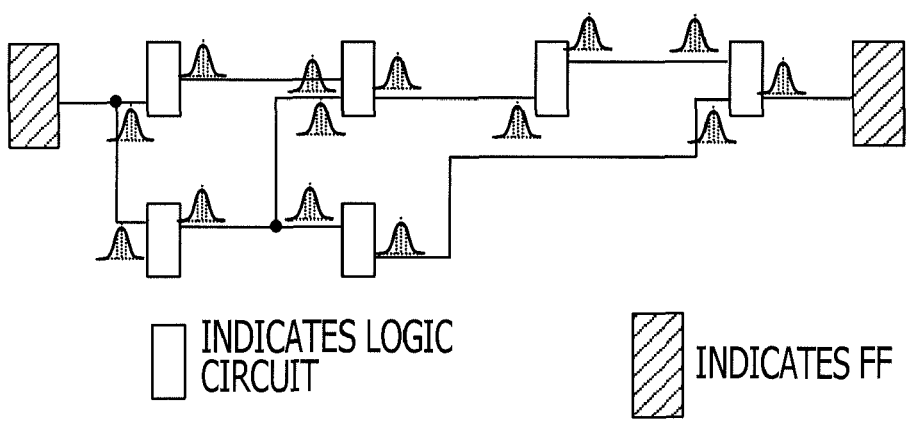

An SSTA processing operation performed in the statistical timing analysis section 10 is performed within a range illustrated in FIG. 3B. Namely, a statistical delay operation is applied to entire logic circuits disposed between the beginning latch and the ending latch. Namely, here, a delay distribution is obtained in view of all paths existing between the beginning latch and the ending latch.

Figure 2:
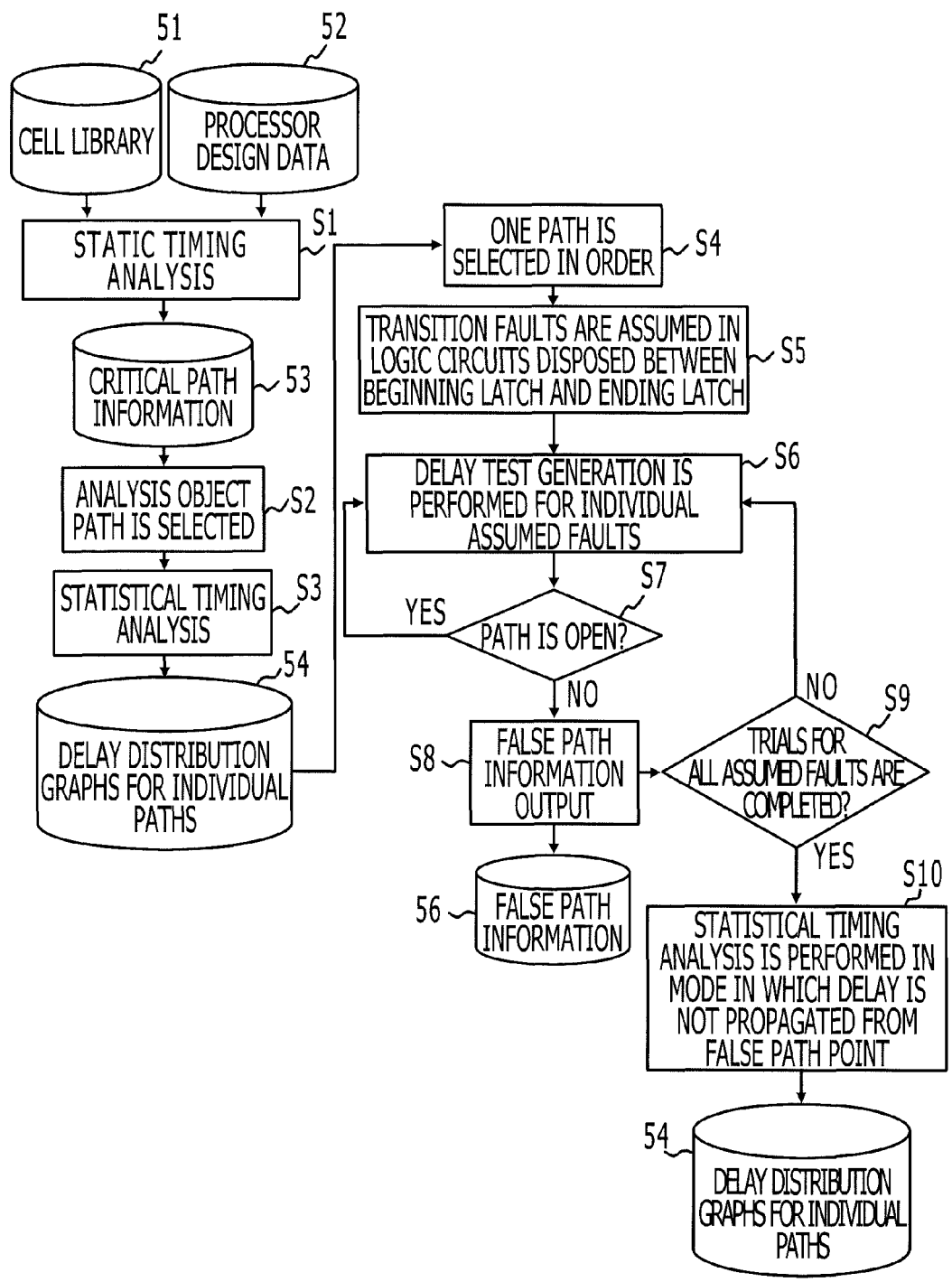
FIG. 2 is a flowchart illustrating an example of an operation of the delay analysis device according to the embodiment.

Returning to the description of FIG. 2, the test object path selection section 13 calculates a value corresponding to $\alpha * \sigma$ with respect to each of delay distributions, and sorts the pairs of beginning latches and ending latches in descending order of value, and the test object path input section 15 acquires one of the pairs of a beginning latch and an ending latch in the sort order (S4). In addition, while, in the embodiment, the value of "$\alpha$" is defined as ($\alpha=-3$), the value of "$\alpha$" may be defined as any constant such as ($\alpha=3$) or the like, for example. The assumed fault setup section 17 sets up a transition fault for each of the pins of logic circuits disposed between the beginning latch and the ending latch which are to be processing objects in accordance with a method of the related art, the transition fault being an assumed fault (S5).

The delay test generation section 18 tries to create a pattern for each of the assumed faults, the pattern being supposed to cause a signal change to occur between the beginning latch and the ending latch of paths that are to be processing objects (S6).

The delay test generation section 18 determines whether or not any one of the paths is open from the viewpoint of delay (S7). When none of the paths is open from the viewpoint of delay (S7, no), the delay test generation section 18 marks the assumed fault point as a false path point, and tries to determine a next assumed fault. When at least one of the paths is open from the viewpoint of delay and a pattern generation is successful (S7, yes), the delay test generation section 18 marks the assumed fault point as non false path point, returns to step S6, and tries to generate a pattern for a next assumed fault.

Figure 4:
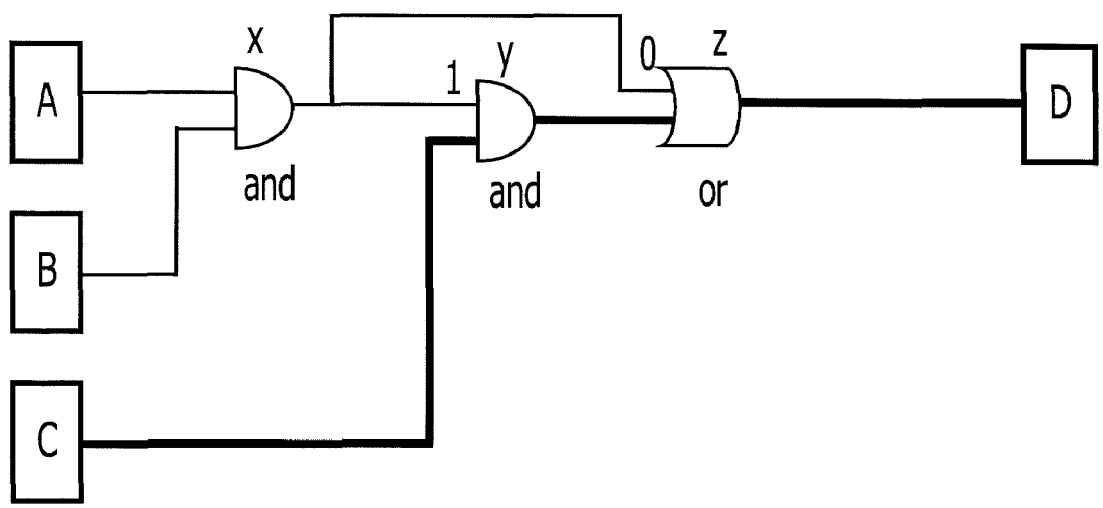
FIG. 4 is an example of a pattern diagram of a circuit used for describing "path is open" according to the embodiment.

Here, the meaning of "path is open from the viewpoint of delay" will be described with reference to FIG. 4. In FIG. 4, it is assumed that a path leading from a latch C to a latch D through a gate y and a gate z is a test object, for example. When the path is in a state in which a signal change generated at the latch C can be propagated to the latch D, it is defined that the path leading from the latch C to the latch D is open from the viewpoint of delay. In addition, in the example illustrated in FIG. 4, the path leading from the latch C to the latch D is blocked. In order for the path leading from the latch C to the latch D to be open, it is necessary for one of the two inputs of the gate y, which is not on the path to become "1" because the gate y is an AND circuit.

On the other hand, it is necessary for one of the two inputs of the gate z which is not on the path to become "0" because the gate z is an OR circuit. Accordingly, while it is necessary for the output of the gate x to become "1" and "0", the condition is logically impossible. Therefore, the path leading from the latch C to the latch D turns out not to be open. Namely, the path leading from the latch C to the latch D is a false path. Since the circuit illustrated in FIG. 4 includes a redundant logic circuit, a false path occurs in the circuit in FIG. 4. While a designer does not intend to design a redundant logic circuit, such a redundant logic circuit can be unintentionally generated as a result.

Returning to FIG. 2, the delay test generation section 18 outputs the in-circuit identification name of a pin to the false path information output section 19 as the false path information 56, the pin being determined as a false path existing between a pair of a beginning latch and an ending latch that are current processing objects (S8). In addition, the delay test generation section 18 determines whether or not pattern generation in delay test operations for all assumed faults is completed (S9). The in-circuit identification names of all pins that are marked as false path points in the processing operation are output for the pair of a beginning latch and an ending latch.

When the pattern generation is not completed (S9, no), the delay test generation section 18 returns to step S6, and tries to generate a pattern at a next assumed fault point. On the other hand, when the pattern generation is completed (S9, yes), the statistical timing analysis section 10 re-executes the SSTA processing operation, and here inputs a pin list corresponding to pins through which paths are not open from the false path information 56. In addition, the statistical timing analysis section 10 performs a processing operation in which a cumulative calculation for a delay distribution is not performed in a direction from a pin cited in the pin list to the latter stages during a processing operation for propagating the delay distribution, and generates the delay distribution graph 54 in which a pin list corresponding to pins blocked from the viewpoint of delay is excluded (S10).

Figure 5:
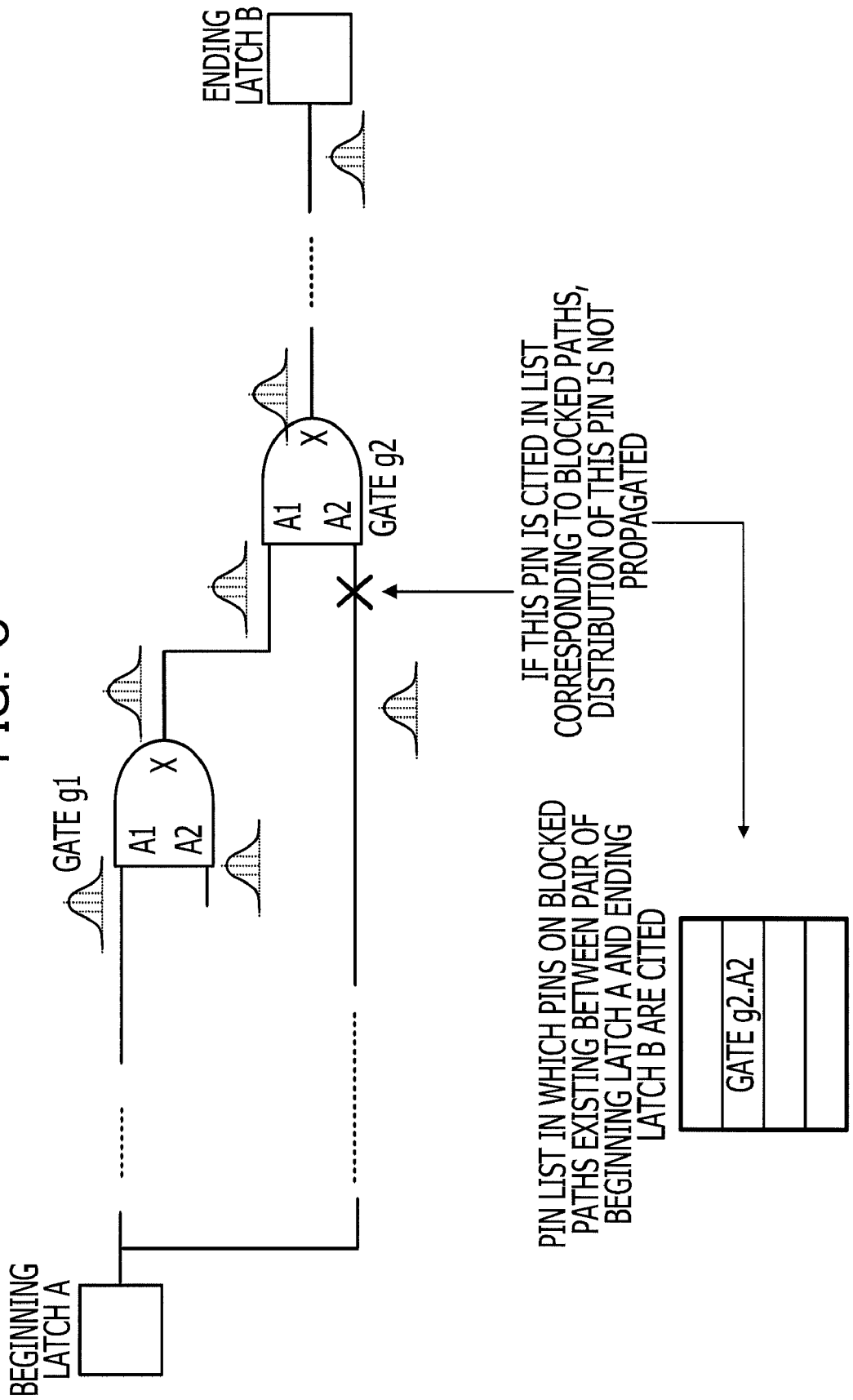
FIG. 5 is a pattern diagram illustrating a state in which an SSTA is re-executed according to the embodiment.

The processing operation performed in step S10 will be described with reference to FIG. 5. FIG. 5 is a pattern diagram illustrating a state in which the SSTA processing operation is re-executed by the statistical timing analysis section 10 for logic circuits disposed between a beginning latch A and an ending latch B. For example, when a pin A2 of a gate g2 disposed between the pair of the beginning latch A and the ending latch B is registered in the false path information 56, the statistical timing analysis section 10 performs a processing operation in which a value difficult to occur normally such as a value "0" is set for the delay value of the pin A2 of the gate g2, and thereby a delay distribution is prevented from being propagated.

The timing yield calculation section 20 calculates a timing yield distribution for the processor by performing the SSTA processing operation in accordance with a method of the related art using the delay distribution obtained for each of pairs of beginning latches and ending latches, obtained in step S10.

In the delay analysis device 100 according to the embodiment, when a path is blocked for a pair of a beginning latch and an ending latch at the time a pattern used for a delay test for each path is generated, it can be determined that the path is logically a false path as a result. In addition, in order to consider false paths in a subset of paths existing between a pair of a beginning latch and an ending latch, the delay analysis device 100 tries to generate a patter using a method based on a transition fault model for each of faults assumed in logic circuits disposed between one pair of a beginning latch and an ending latch. Even if a path is open for any one of assumed faults, the delay analysis device 100 tries to generate patterns for other assumed faults. The delay analysis device 100 lists assumed faults in which paths are blocked for each of pairs of beginning latches and ending latches.

When the delay analysis device 100 obtains delay distributions for logic circuits disposed between a pair of a beginning latch and an ending latch, the delay analysis device 100 acquires a pin list in which pins on blocked paths existing between the pair of a beginning latch and an ending latch are cited, and adopts a method in which delay distributions are not propagated from pins, cited in the pin list in the SSTA processing operation. When delay distributions are obtained, false paths existing between each of pairs of a beginning latch and an ending latch are correctly considered by acquiring a pin list in which pins on blocked paths existing between the pair of a beginning latch and an ending latch are cited, and adopting a method in which delay distributions are not propagated from pins cited in the pin list in the SSTA processing operation.

In the embodiment, in a block-based statistical timing analysis that is widely used as a statistical timing analysis, the delay distribution of each path is obtained. In addition, when the timing yield distribution of an entire integrated circuit is calculated by performing a statistical MAX processing operation for the obtained delay distribution of each path, an analysis is easily performed in which false paths are excluded, the false paths not affecting the timing yield distribution because the false paths are blocked logically. Accordingly, a timing yield analysis result that has a correlation with a realistic phenomenon can be obtained.

Figure 6:
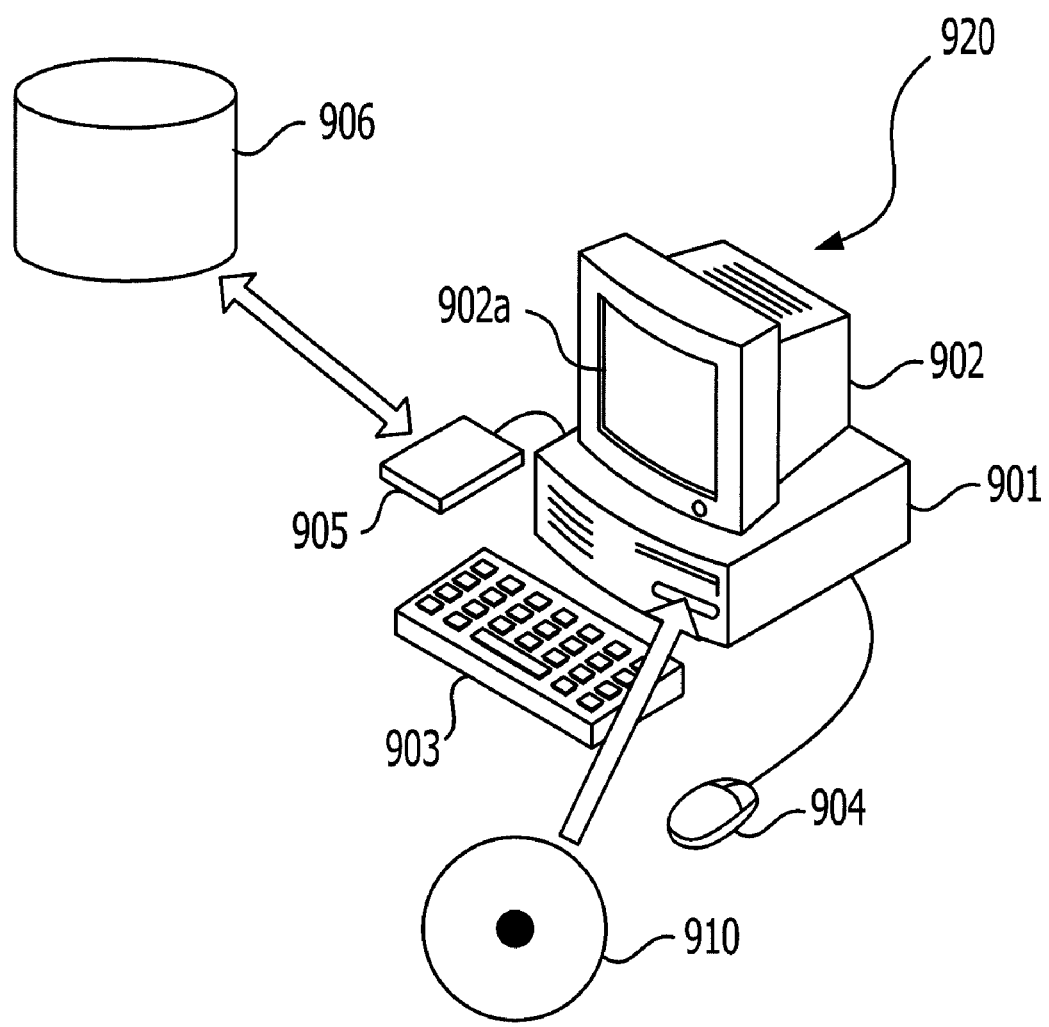
FIG. 6 is a diagram illustrating an example of a hardware configuration of a computer system applicable to the delay analysis device according to the embodiment.

The invention is applicable to a computer system described later. FIG. 6 is a diagram illustrating an example of the computer system to which the invention is applicable. A computer system 920 illustrated in FIG. 6 includes a chassis 901 in which a central processing unit (CPU), a memory, and a disk drive or the like are embedded, a display 902 that displays an image in response to an instruction from the chassis 901, a keyboard 903 that inputs various kinds of information into the computer system 920, a mouse 904 that specifies an arbitrary position on a display screen 902*a* on the display 902, and a communication apparatus 905 that accesses an external database or the like and downloads a program or the like stored in another computer system. As the communication apparatus 905, a network communication card or a modem can be considered.

A program used for causing the individual steps mentioned above to be executed in the computer system included in the delay analysis device as described above can be provided as a delay analysis program. The program can be executed in the computer system included in the delay analysis device by storing the program in a recording medium that the computer system can read. The program used for causing the individual steps mentioned above to be executed is stored into a portable recording medium such as the disk 910 or the like, or downloaded from a recording medium 906 in another computer system using the communication apparatus 905. In addition, the delay analysis program (delay analysis software) which allows the computer system 920 to have at least a delay analysis function is input into the computer system 920 and compiled. The program causes the computer system 920 to operate as a delay analysis device that includes a delay analysis function. In addition, the program may be stored in a computer-readable recording medium such as the disk 910 or the like. Here, examples of the recording medium that the computer system 920 can read include internal storage devices internally implemented in computers, such as a read only memory (ROM) and a random access memory (RAM) or the like, portable recording media such as the disk 910, a flexible disk, a digital versatile disk (DVD), a magneto optical disk (MO), and an integrated circuit (IC) card or the like, a database that holds a computer program, another computer system and a database thereof, and various kinds of recording media that are connected to the computer system through communication means such as the communication apparatus 905 and can be accessed by the computer system.

Figure 7:
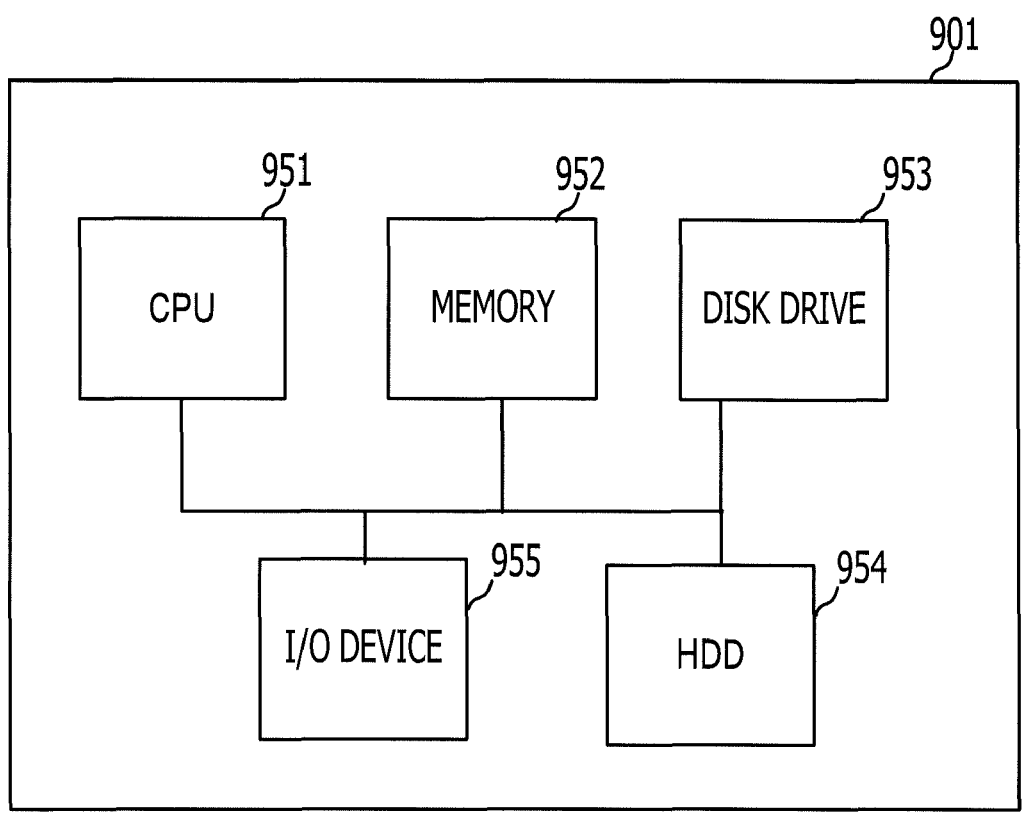
FIG. 7 is a diagram illustrating an example of a hardware configuration of a chassis in the computer system applicable to the delay analysis device according to the embodiment.

FIG. 7 is a diagram illustrating an example of the hardware configuration of the chassis 901 in the computer system 920. The chassis 901 includes a CPU 951, a memory 952 (corresponds to the above-mentioned memory 61), a disk drive 953 that reads and writes data from and into a portable recording medium such as the disk 910 or the like, and a hard disk drive (HDD) 954 that is nonvolatile memory means, and further includes an I/O device 955 that controls communication with the outside. For example, a program preliminarily held in the nonvolatile memory means such as the HDD 954, disk 910, or the like collaborates with hardware resources such as the CPU 951 and the memory 952 or the like, and thereby the individual functional sections mentioned above are realized. In addition, the individual pieces of data mentioned above are stored in the HDD 954 or the memory 952.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A delay analysis device for analyzing a delay of a semiconductor device, the delay analysis device comprising:
    an acquisition section that acquires circuit information relating to a path through which signal propagation can be delayed between a beginning latch and an ending latch included in an integrated circuit;
    a determination section that sets up an assumed fault for each of pins disposed between the beginning latch and the ending latch based on the acquired circuit information, and determines whether a signal change output from the beginning latch can be propagated to the ending latch for each of pins for which the assumed faults are set up;
    an analysis section that calculates a delay distribution for the path by accumulating delay distributions expressed by using probability density functions of delays that occur in individual delay elements included in the path leading from the beginning latch to the ending latch at a pin through which it has been determined that a signal change output from the beginning latch can be propagated to the ending latch, and by not accumulating the delay distributions at a pin through which it has been determined that the signal change cannot be propagated to the ending latch based on the acquired circuit information; and
    an output section that outputs the delay distribution for the semiconductor device in which the delay distributions at pins through which the signal change cannot be propagated are excluded.

2. The delay analysis device according to claim 1, further comprising:
    a pair selection section that selects a plurality of pairs of a beginning latch and an ending latch included in the integrated circuit based on the acquired circuit information;
    a statistical timing analysis section that performs a statistical timing analysis on paths leading from the beginning latches to the ending latches included in the selected plurality of pairs and calculate delay distributions individually corresponding to the selected plurality of pairs; and
    a sort section that sorts the selected plurality of pairs based on the individual deviations of the calculated delay distributions individually corresponding to the plurality of pairs, wherein the acquisition section individually acquires pieces of circuit information relating to paths through which signal propagation can be delayed between beginning latches and ending latches in order of the pairs sorted by the sort section; and
    the determination section sets up an assumed fault for each of pins disposed between the beginning latch and the ending latch in order of the pairs acquired by the acquisition section, and determines for each of pins for which assumed faults are set up whether a signal change output from the beginning latch can be propagated to the ending latch.

3. The delay analysis device according to claim 2, wherein the pair selection section selects the plurality of pairs of beginning latches and ending latches included in paths included in the integrated circuit through which signal propagation can be delayed by accumulating delay values expressing delays using individual values that individually occur in a plurality of delay elements included in the path from the beginning latch to the ending latch, and calculating a delay value for the path.

4. The delay analysis device according to claim 2, wherein the sort section calculates individual standard deviations of the delay distributions that are calculated by the statistical timing analysis section and individually correspond to the plurality of pairs, and sorts values in descending order, the values being acquired by multiplying the calculated standard deviations by a predetermined constant.

5. A delay analysis method for analyzing a delay of a semiconductor device, the delay analysis method comprising:
    acquiring circuit information relating to a path through which signal propagation can be delayed between a beginning latch and an ending latch included in an integrated circuit;
    setting up an assumed fault for each of pins disposed between the beginning latch and the ending latch based on the acquired circuit information;

determining whether a signal change output from the beginning latch can be propagated to the ending latch for each of pins for which assumed faults are set up; and calculating a delay distribution for the path by accumulating delay distributions expressed by using probability density functions of delays that occur in individual delay elements included in the path leading from the beginning latch to the ending latch at a pin through which it has been determined that a signal change output from the beginning latch can be propagated to the ending latch, and by not accumulating the delay distributions at a pin through which it has been determined that the signal change cannot be propagated to the ending latch based on the acquired circuit information; and outputting the delay distribution for the semiconductor device in which the delay distributions at pins through which the signal change cannot be propagated are excluded.

6. The delay analysis method according to claim 5, further comprising:

selecting a plurality of pairs of a beginning latch and an ending latch included in the integrated circuit based on the acquired circuit information;

performing a statistical timing analysis on paths leading from the beginning latches to the ending latches included in the selected plurality of pairs;

calculating delay distributions individually corresponding to the selected plurality of pairs; and sorting the selected plurality of pairs based on the individual deviations of the calculated delay distributions individually corresponding to the plurality of pairs;

wherein the acquiring acquire pieces of circuit information, which relate to paths through which signal propagation can be delayed between beginning latches and ending latches in order of the pairs sorted by the sort section; and the setting sets up an assumed fault is set up for each of pins disposed between the beginning latch and the ending latch in order of the pairs acquired by the acquisition section, and determines for each of pins for which assumed faults are set up whether a signal change output from the beginning latch can be propagated to the ending latch.

7. The delay analysis method according to claim 6, wherein the selecting selects the plurality of pairs of beginning latches and ending latches included in paths included in the integrated circuit through which signal propagation can be delayed by accumulating delay values expressing delays using individual values that individually occur in a plurality of delay elements included in the path from the beginning latch to the ending latch, and calculating a delay value for the path.

8. The delay analysis method according to claim 6, wherein the sorting calculates individual standard deviations of the delay distributions that are calculated by the calculating and individually correspond to the plurality of pairs, and sorts values in descending order, the values being acquired by multiplying the calculated standard deviations by a predetermined constant.

9. A computer-readable medium storing a delay analysis program for directing a computer to perform an operation of analyzing delay of a semiconductor device, the operation comprising:

acquiring circuit information relating to a path through which signal propagation can be delayed between a beginning latch and an ending latch included in an integrated circuit;

setting up an assumed fault for each of pins disposed between the beginning latch and the ending latch based on the acquired circuit information;

determining whether a signal change output from the beginning latch can be propagated to the ending latch for each of pins for which assumed faults are set up;

calculating a delay distribution for the path by accumulating delay distributions expressed by using probability density functions of delays that occur in individual delay elements included in the path leading from the beginning latch to the ending latch at a pin through which it has been determined that a signal change output from the beginning latch can be propagated to the ending latch, and by not accumulating the delay distributions at a pin through which it has been determined that the signal change cannot be propagated to the ending latch based on the circuit information, based on the acquired circuit information; and outputting the delay distribution for the semiconductor device in which the delay distributions at pins through which the signal change cannot be propagated are excluded.

10. The computer-readable medium according to claim 9, the operation further comprising:

selecting a plurality of pairs of a beginning latch and an ending latch included in the integrated circuit based on the acquired circuit information;

performing a statistical timing analysis on paths leading from the beginning latches to the ending latches included in the selected plurality of pairs;

calculating delay distributions individually corresponding to the selected plurality of pairs; and sorting the selected plurality of pairs based on the individual deviations of the calculated delay distributions individually corresponding to the plurality of pairs;

wherein the acquiring acquire pieces of circuit information, which relate to paths through which signal propagation can be delayed between beginning latches and ending latches in order of the pairs sorted by the sort section; and the setting sets up an assumed fault is set up for each of pins disposed between the beginning latch and the ending latch in order of the pairs acquired by the acquisition section, and determines for each of pins for which assumed faults are set up whether a signal change output from the beginning latch can be propagated to the ending latch.

11. The computer-readable medium according to claim 10, wherein the selecting selects the plurality of pairs of beginning latches and ending latches included in paths included in the integrated circuit through which signal propagation can be delayed by accumulating delay values expressing delays using individual values that individually occur in a plurality of delay elements included in the path from the beginning latch to the ending latch, and calculating a delay value for the path.

12. The computer-readable medium according to claim 10, wherein the sorting calculates individual standard deviations of the delay distributions that are calculated by the calculating and individually correspond to the plurality of pairs, and sorts values in descending order, the values being acquired by multiplying the calculated standard deviations by a predetermined constant.

* * * * *

UNITED STATES PATENT AND TRADEMARK OFFICE
CERTIFICATE OF CORRECTION

PATENT NO. : 8,407,021 B2
APPLICATION NO. : 12/893362
DATED : March 26, 2013
INVENTOR(S) : Noriyuki Ito It is certified that error appears in the above-identified patent and that said Letters Patent is hereby corrected as shown below:

On the Title Page, item [56], Column 1 (Foreign Application Priority Data), Line 1, Delete "2009-231728" and insert --2009-231723--, therefor.

In the Claims:

Column 11, Line 3, In Claim 5, delete "set up; and" and insert --set up;--, therefor.

Signed and Sealed this
Sixteenth Day of July, 2013

Teresa Stanek Rea
*Acting Director of the United States Patent and Trademark Office*